US012615940B2

(12) United States Patent
Sakamoto

(10) Patent No.: US 12,615,940 B2
(45) Date of Patent: Apr. 28, 2026

(54) LIGHT-EMITTING ELEMENT WITH A PIXEL ELECTRODE HAVING AN UNEVEN STRUCTURE

(71) Applicant: Magnolia White Corporation, Tokyo (JP)

(72) Inventor: Asami Sakamoto, Tokyo (JP)

(73) Assignee: MAGNOLIA WHITE CORPORATION, Tokyo (JP)

( * ) Notice: Subject to any disclaimer, the term of this patent is extended or adjusted under 35 U.S.C. 154(b) by 581 days.

(21) Appl. No.: 18/109,274

(22) Filed: Feb. 14, 2023

(65) Prior Publication Data

US 2023/0263026 A1 Aug. 17, 2023

(30) Foreign Application Priority Data

Feb. 15, 2022 (JP) ................................. 2022-021558

(51) Int. Cl.
| | |
|---|---|
| *H10K 59/35* | (2023.01) |
| *H10K 59/80* | (2023.01) |
| *H10K 102/00* | (2023.01) |
| *H10K 102/10* | (2023.01) |

(52) U.S. Cl.
CPC ......... *H10K 59/352* (2023.02); *H10K 59/353* (2023.02); *H10K 59/805* (2023.02); *H10K 59/80521* (2023.02); *H10K 2102/102* (2023.02); *H10K 2102/103* (2023.02); *H10K 2102/351* (2023.02)

(58) Field of Classification Search
CPC .. H10K 59/352; H10K 59/353; H10K 59/131;

H10K 59/80515; H10K 59/8052; H10K 59/805; H10K 2102/351; H10K 59/80521; H10K 59/171; H10K 59/822

See application file for complete search history.

(56) References Cited

U.S. PATENT DOCUMENTS

| | | | | | |
|---|---|---|---|---|---|
| 6,670,772 | B1 * | 12/2003 | Arnold | ................. | H10K 59/124 |
| | | | | | 313/504 |
| 9,806,277 | B2 * | 10/2017 | Jeon | ..................... | H10K 59/124 |
| 9,978,819 | B2 * | 5/2018 | Jang | ................. | H10K 59/80521 |
| 10,347,871 | B2 * | 7/2019 | Joung | ..................... | H10K 50/11 |
| 10,424,761 | B2 * | 9/2019 | Choi | ..................... | H10K 59/879 |
| 10,707,285 | B2 * | 7/2020 | Kwon | .............. | H10K 59/80515 |
| 10,903,282 | B2 * | 1/2021 | Choi | ..................... | H10K 59/879 |
| 2003/0044639 | A1 | 3/2003 | Fukuda | | |
| 2012/0256201 | A1 * | 10/2012 | Lee | ..................... | H10K 59/8731 |
| | | | | | 257/E33.059 |

(Continued)

FOREIGN PATENT DOCUMENTS

| | | | |
|---|---|---|---|
| JP | 2000-323277 A | 11/2000 | |
| KR | 20150077261 A * | 7/2015 | ........... H10K 50/858 |

*Primary Examiner* — Alonzo Chambliss
(74) *Attorney, Agent, or Firm* — XSENSUS LLP

(57) ABSTRACT

A light-emitting element includes a pixel electrode arranged on an inorganic insulating film having an uneven structure on a first surface, and having a first electrode and a second electrode having an uneven structure finer than the uneven structure on a third surface, an electron injection layer arranged on the second electrode, an electron transport layer arranged on the electron injection layer, a light-emitting layer arranged on the electron transport layer and a common electrode arranged on the light-emitting layer.

14 Claims, 11 Drawing Sheets

(56)  References Cited

U.S. PATENT DOCUMENTS

| | | | |
|---|---|---|---|
| 2015/0263235 A1* | 9/2015 | Shin | H10D 86/421 |
| | | | 257/72 |
| 2016/0155784 A1* | 6/2016 | Park | H10K 50/822 |
| | | | 438/23 |
| 2016/0155787 A1* | 6/2016 | Lee | H10K 59/123 |
| | | | 438/23 |
| 2019/0081264 A1* | 3/2019 | Yun | H10K 50/12 |
| 2019/0103442 A1* | 4/2019 | Choi | H10K 59/80521 |
| 2019/0189966 A1* | 6/2019 | Jang | H10K 50/822 |
| 2023/0200104 A1* | 6/2023 | Yamazaki | H10K 85/6572 |
| | | | 257/40 |

* cited by examiner

FIG. 3

LIGHT-EMITTING ELEMENT WITH A PIXEL ELECTRODE HAVING AN UNEVEN STRUCTURE

CROSS-REFERENCE TO RELATED APPLICATIONS

This application claims the benefit of priority to Japanese Patent Application No. 2022-021558, filed on Feb. 15, 2022, the entire contents of which are incorporated herein by reference.

FIELD

An embodiment of the present invention relates to a light-emitting element and a display device.

BACKGROUND

An organic EL display device (Organic Electroluminescence Display) is known as one type of display device. The organic EL display device uses an organic EL element containing a self-emitting organic electroluminescence material (organic EL material) for a light-emitting element of a display unit. For example, the organic EL element is an element in which an organic EL material is arranged between a pixel electrode and a counter electrode (common electrode). The organic EL display device is capable of causing the organic EL element to emit light and display images on the display unit by applying a voltage on each of the pixel electrode and the counter electrode and passing a current through the organic EL material.

For example, the organic EL display device has a structure in which an organic EL element is arranged on one substrate, so that the thickness of the device can be made thinner than a liquid crystal display device, which has a structure in which a liquid crystal element is sandwiched between two substrates. In recent years, there has been an increasing demand for further thinning in an organic EL display device.

SUMMARY

A light-emitting element according to an embodiment of the present invention includes a pixel electrode arranged on an inorganic insulating film having an uneven structure on a first surface, and having a first electrode and a second electrode having an uneven structure finer than the uneven structure on a third surface, an electron injection layer arranged on the second electrode, an electron transport layer arranged on the electron injection layer, a light-emitting layer arranged on the electron transport layer, and a common electrode arranged on the light-emitting layer.

A display device according to an embodiment of the present invention includes a light-emitting element, a display unit provided with a plurality of the light emitting elements, and a control circuit electrically connected to the plurality of the light emitting elements and controlling the plurality of the light emitting elements. The light-emitting element includes a pixel electrode arranged on an inorganic insulating film having an uneven structure on a first surface, and having a first electrode and a second electrode having an uneven structure finer than the uneven structure on a third surface, an electron injection layer arranged on the second electrode, an electron transport layer arranged on the electron injection layer, a light-emitting layer arranged on the electron transport layer, and a common electrode arranged on the light-emitting layer.

BRIEF DESCRIPTION OF DRAWINGS

FIG. 3 is a cross-sectional view showing a part of a cross-section cut along a line B1-B2 of the pixel shown in FIG. 2.

DESCRIPTION OF EMBODIMENTS

Figure 1:
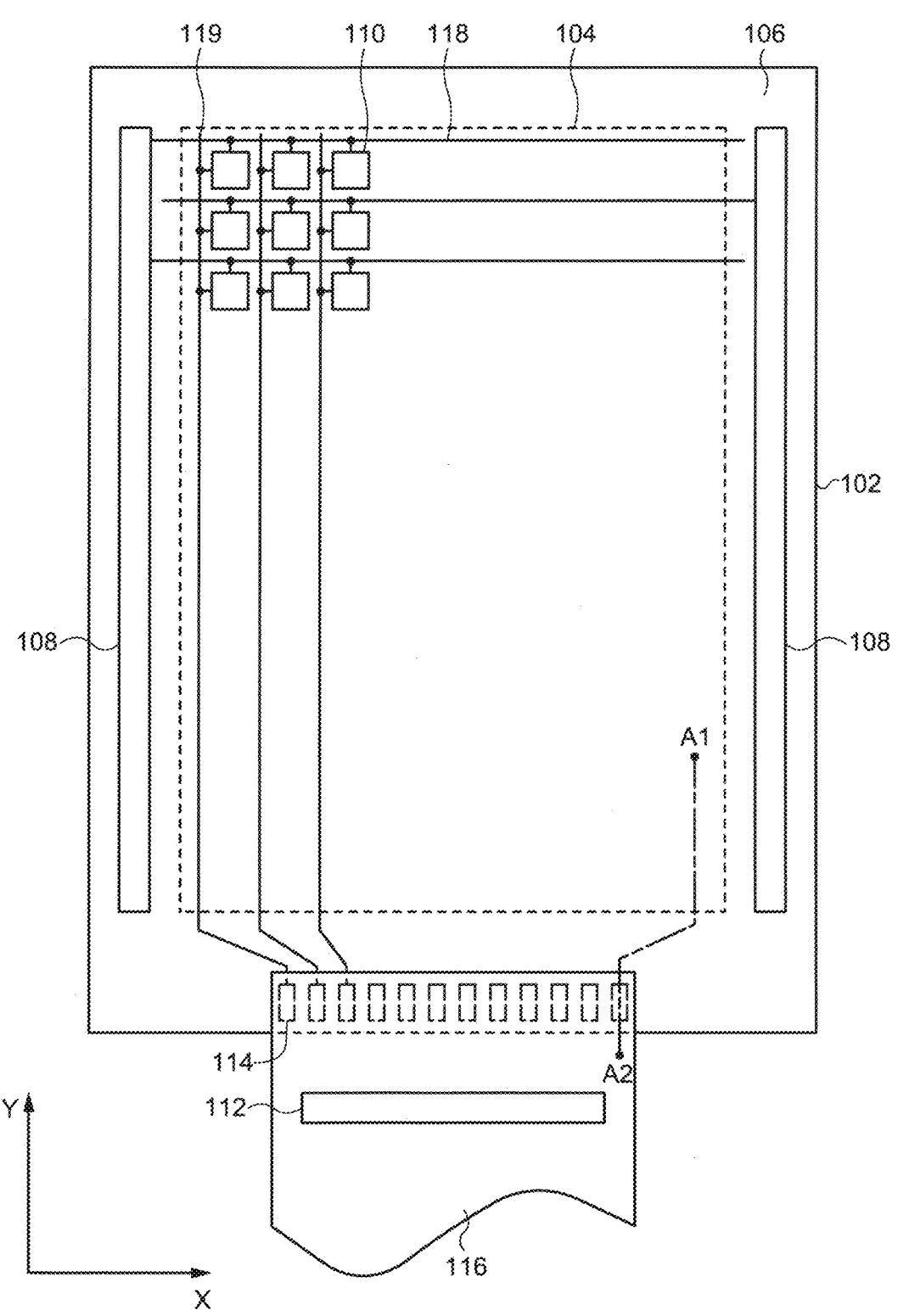
FIG. 1 is a plan view showing a configuration of a display device according to an embodiment of the present invention.

Hereinafter, embodiments of the present invention will be described with reference to the drawings and the like. However, the present invention can be implemented in various aspects without departing from the gist thereof, and is not to be construed as being limited to the description of the embodiments exemplified below. In addition, in order to make the description clearer with respect to the drawings, the width, thickness, shape, and the like of each part may be schematically represented in comparison with actual embodiments, but the schematic drawings are merely examples, and do not limit the interpretation of the present invention. Further, in the present specification and the drawings, the same or similar elements as those described with respect to the above-described drawings are denoted by the same symbols, and redundant descriptions may be omitted.

In the present invention, in the case of forming a plurality of films by processing one film, the plurality of films may have different functions and roles. However, the plurality of films is derived from films formed as the same layer in the same process, and have the same layer structure and the same material. Therefore, the plurality of films is defined as being present in the same layer.

In each embodiment of the present invention, expressions such as "above" and "below" in describing the drawings represent a relative positional relationship between a structure of interest and another structure. In each embodiment of the present invention, a direction from an insulating surface to a bank, which will be described later, is defined as "above" and the opposite direction is defined as "below" in a side view. In each embodiment of the present invention, in expressing the method of arranging another structure on a certain structure, the term "on" shall include both the case of arranging another structure directly above a certain structure and the case of arranging another structure above a certain structure via yet another structure, unless otherwise specified.

In addition, in each embodiment of the present invention, the expression "α includes A, B, or C," "a includes any of A, B, and C," "a includes one selected from a group consisting of A, B, and C," and the like does not exclude the case where a includes a plurality of combinations of A to C unless otherwise specified. Further, these expressions do not exclude the case where a includes other elements.

Further, in each embodiment of the present invention, the same symbols (or symbols having numbers followed by A, B, a, b, and the like) are given to elements similar to those described above with respect to the above-mentioned figures, and the detailed description thereof may be omitted as appropriate. In addition, the terms "first" and "second" appended to each element are convenient signs used to distinguish each element, and do not have any further meaning unless otherwise specified.

In order to reduce the thickness of an organic EL display device, for example, the luminous efficacy of a light-emitting element may be reduced. In addition, as the luminous efficacy of the light-emitting element decreases, the long-term reliability of the organic EL display device is deteriorated.

In view of the above, an object of the present invention is to provide an organic EL display device in which a decrease in luminous efficacy of a light-emitting element is suppressed and a decrease in long-term reliability is small.

In some embodiments described below, an organic EL display device in which a decrease in luminous efficacy of a light-emitting element is suppressed and a decrease in long-term reliability is small is exemplified.

1. BACKGROUND OF INVENTION

A configuration of a light-emitting element used in an organic EL display device is roughly divided into two configurations: a configuration (normal-stacked configuration) in which a pixel electrode is an anode and a common electrode of the light-emitting element is a cathode, or a configuration (reverse-stacked configuration) in which a pixel electrode is a cathode and a common electrode of the light-emitting element is an anode. In a light-emitting element formed on a substrate, the common electrode is formed above the pixel electrode with respect to the substrate. A sealing film is arranged on the common electrode to prevent water and oxygen from entering the light-emitting element. For example, a thickness of the sealing film in the reverse-stacked configuration is thinner than a thickness of the sealing film in the normal-stacked configuration.

In order to reduce the thickness of the organic EL display device, in a light-emitting element in which the reverse-stacked configuration is applied, for example, the electron injection efficiency of electrons from the pixel electrode to a light-emitting layer through an electron injection layer and an electron transport layer is low. Therefore, in a light-emitting element with the reverse-stacked configuration, a decrease in luminous efficacy is feared. In the organic EL display device, research is being conducted to suppress a decrease in the luminous efficiency of the light-emitting element.

A light-emitting element 172 (FIG. 4) of an organic EL display device 10 according to an embodiment of the present invention includes an insulating film 144 (FIG. 4, FIG. 5), an inorganic insulating film 146 arranged on the insulating film 144 and having an uneven structure 230 (FIG. 5) on its surface (a first surface 250 (FIG. 5)), a pixel electrode 150 (FIG. 4) arranged on the inorganic insulating film 146 and having two layers of a first pixel electrode 150a (FIG. 4 and FIG. 5) and a second pixel electrode 150b having an uneven structure finer than the uneven structure 230 on the surface (a third surface 252 (FIG. 5)), an electron injection layer 154a (FIG. 4 and FIG. 5) arranged on the pixel electrode 150, a light-emitting layer 156 (FIG. 4) arranged on the electron injection layer 154a, and a common electrode 160 (FIG. 4) arranged on the light-emitting layer 156. The pixel electrode 150 is a cathode and the common electrode 160 is an anode. The first pixel electrode 150a is formed using a transparent conductive film containing a transparent conductive material. The second pixel electrode 150b is formed using a metal oxide film containing a metal oxide material having a grain size smaller than the transparent conductive material forming the first pixel electrode 150a.

As will be described later, in the light-emitting element 172 of the organic EL display device 10 according to an embodiment of the present invention, a reverse-stacked configuration that covers the common electrode with a thin sealing film is applied. Since the light-emitting element 172 of the organic EL display device 10 has the above-described configuration, an energy barrier height between the pixel electrode 150 and the electron injection layer 154a is reduced, and electrons are easily transferred from the pixel electrode 150 to the electron injection layer 154a. That is, in the organic EL display device 10, even if the voltage difference between a voltage applied to the anode and a voltage applied to the cathode is the same as the conventional voltage difference, many electrons can be transferred from the pixel electrode 150 to the electron injection layer 154a. As a result, since more electrons are injected from the electron injection layer 154a to the light-emitting layer 156 via an electron transport layer 154b, the organic EL display device 10 according to an embodiment of the present invention has improved luminous efficacy.

In an embodiment of the present invention, the organic EL display device 10 is simply referred to as the display device 10, a state where the display device 10 is viewed from a direction perpendicular to a screen (display unit) is referred to as a "plan view," and a state where the display device 10 is cut along a plane or a curved surface intersecting the insulating surface and where the cut surface is viewed from a direction parallel to the screen is referred to as a "cross-sectional view."

2. First Embodiment

The display device 10 according to an embodiment of the present invention will be described with reference to FIG. 1 to FIG. 6. The form of the display device 10 shown in FIG. 1 to FIG. 6 is an example, and the form of the display device 10 is not limited to the form shown in FIG. 1 to FIG. 6.

2-1. Configuration of Display Device 10

FIG. 1 is a schematic view showing a configuration of the display device 10. As shown in FIG. 1, for example, the display device 10 includes a display unit 104 formed on the insulating surface, a peripheral part 106, a scanning line driving circuit 108, a driver IC 112, a terminal unit in which a plurality of terminals 114 are arranged, and a flexible printed circuit board 116. The peripheral part 106 surrounds the display unit 104. Although the driver IC 112 is arranged in a COF (Chip on Film) method on the flexible printed circuit board 116, the arrangement of the driver IC 112 is not limited to the example shown here. The driver IC 112 may be arranged on a substrate 102. The flexible printed circuit board 116 is connected to the terminal unit in which the plurality of terminals 114 arranged in the peripheral part 106 is arranged.

A plurality of scanning lines 118 is connected to the scanning line driving circuit 108. The plurality of scanning lines 118 is arranged to extend in a direction X of the display device 10. A data line 119 is connected to each of the plurality of terminals 114. The plurality of data lines 119 is arranged to extend in a direction Y of the display device 10. The plurality of data lines 119 is electrically connected to the driver IC 112.

The driver IC 112 functions as a control unit that supplies signals and voltages to the scanning line driving circuit 108 and a data line driving circuit. The data line driving circuit may be arranged with a sampling switch or the like on the substrate 102 separately from the driver IC 112. The driver IC 112 may include, for example, the data line driving circuit. In the present embodiment, the driver IC 112, the scanning line driving circuit 108, and the data line driving circuit may be collectively referred to as a control circuit.

In the present embodiment, the insulating surface is a surface of the substrate 102. The substrate 102 supports each layer constituting a transistor, the light-emitting element, and the like arranged on the surface of the substrate 102. The substrate 102 may be made of an insulating material, the surface of the substrate 102 may be an insulating surface, and a surface of an insulating film separately formed on the substrate 102 may be an insulating surface. The material of the substrate 102 and the material for forming the insulating film are not particularly limited as long as an insulating surface can be obtained.

A plurality of pixels 110 is arranged in a matrix in the direction X and the direction Y in the display unit 104. Each of the plurality of pixels 110 includes a pixel circuit and the light-emitting element 172 (FIG. 3) electrically connected to the pixel circuit. The light-emitting element 172 includes, for example, the pixel electrode 150, the light-emitting layer 156 (FIG. 3) stacked on the pixel electrode, an organic layer (light-emitting unit) formed using an organic material, and a counter electrode (the common electrode) 160. As will be described later, in the present embodiment, the organic layer includes a first common layer 154 (FIG. 3), the light-emitting layer 156 (FIG. 2), and a second common layer 158 (FIG. 3).

The light-emitting element 172 included in each of the plurality of pixels 110 emits different colors from each other. For example, the pixel 110 emits a color of either a red light-emitting element, a green light-emitting element, or a blue light-emitting element. In the present embodiment, a component included in the red light-emitting element is indicated by R (red), a component included in the green light-emitting element is indicated by G (green), and a component included in the blue light-emitting element is indicated by B (blue). In addition, an emission peak wavelength of the blue light-emitting element is 460 nm or more and 500 nm or less. An emission peak wavelength of the red light-emitting element is 610 nm or more and 780 nm or less. An emission peak wavelength of the green light-emitting element is 500 nm or more and 570 nm or less.

Each of the plurality of pixels 110 is electrically connected to the corresponding scanning line 118 and the corresponding data line 119. In addition, the plurality of pixels 110 is electrically connected to a power supply line for supplying power. Any element may be used as the elements constituting the pixel circuit as long as the element has a current control function. For example, the pixel circuit is composed of a plurality of transistors and capacitive elements. For example, a thin film transistor (TFT) can be used as the plurality of transistors. For example, the driver IC 112 outputs a scanning signal to the scanning line 118 via the scanning line driving circuit 108. The driver IC 112 outputs a data signal corresponding to data (image data) of an image displayed on the display unit 104 to the data line 119. In addition, the driver IC 112 supplies a voltage to the scanning line driving circuit 108, the pixel circuit, and the power supply line. When the voltage, the scanning signal, and the data signal are input from the driver IC 112 to the pixel circuit included in the plurality of pixels 110, the plurality of transistors included in the pixel circuit can supply a voltage corresponding to the image data to the pixel electrode 150 of the light-emitting element 172 using the voltage, the scanning signal, and the data signal. As a result, each of the plurality of pixels 110 can display a color and an image corresponding to the data signal.

2-2. Pixel Arrangement of Display Device 10

Figure 2:
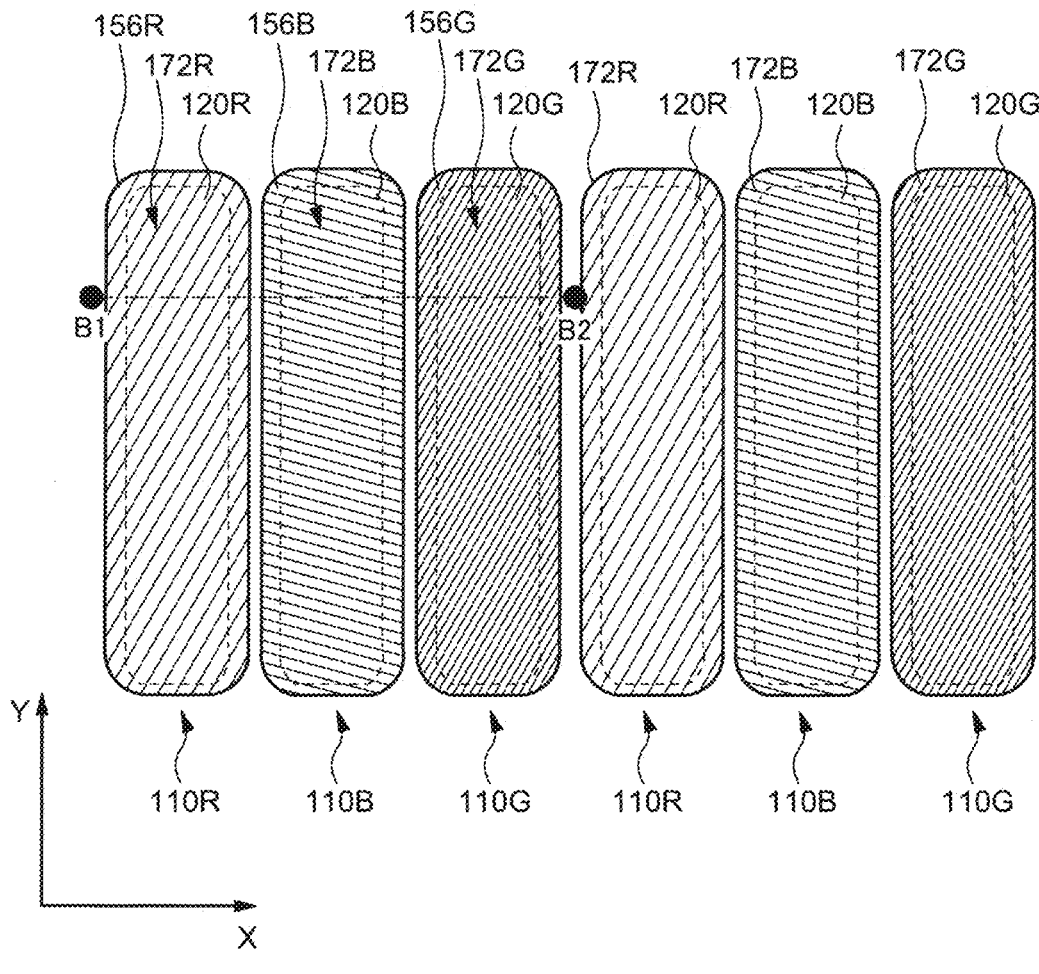
FIG. 2 is an enlarged view of pixels included in a display device according to an embodiment of the present invention.

FIG. 2 is an enlarged view of the pixel 110 when the display device 10 is in a plan view. A pixel arrangement of the display device 10 is, for example, a stripe arrangement. In the configuration of FIG. 2, the description of a configuration the same or similar to that of FIG. 1 may be omitted. FIG. 2 is a diagram showing an area where a pixel 110R, a pixel 110G, and a pixel 1108 are arranged. The pixels 110R, 110G, and 1108 are arranged side by side in the direction X. Although not shown, the plurality of pixels 110R, the plurality of pixels 110G, and the plurality of pixels 1108 are arranged side by side in the direction Y.

An area indicated by a solid line in FIG. 2 is an area where light-emitting layers 156R, 156G, and 156B are arranged. In addition, an area surrounded by a dotted line is an area where openings 120R, 120G, and 120B are arranged in an insulating film 152 (FIG. 3). The insulating film 152 (FIG. 3) is also referred to as a barrier or a bank. The openings 120R, 120G, and 120B arranged in the insulating film 152 (FIG. 3) correspond to an emission area when light-emitting elements 172R, 172G, and 172B actually emit light. In the present embodiment, when the light-emitting layers 156R, 156G, and 156B are not distinguished from each other, the light-emitting layer is referred to as the light-emitting layer 156. In addition, each component of the light-emitting elements 172R, 172G, and 172B is referred to as the light-emitting element 172 similar to the light-emitting layer.

2-3. Cross-Section of Display Device 10

FIG. 3 is a cross-sectional view showing a part of a cross-section cut along a line B1-B2 of the display device 10 (the pixel 110R, the pixel 110G, and the pixel 110B) shown in FIG. 2. In the configuration of FIG. 3, the description of the same or similar configuration as in FIGS. 1 and FIG. 2 may be omitted. According to the cross-sectional view shown in FIG. 3, a plurality of transistors 200 and capacitive elements 220 are arranged on the substrate 102 via a base film 122. The pixel circuit is formed using the plurality of transistors 200 and the capacitive element 220. An insulating film 134 is arranged on a gate insulating film 130 and a gate electrode 132. A capacitor line 136 is arranged on the insulating film 134.

The transistor 200 is configured using at least a semiconductor layer 124, the gate insulating film 130, and the gate electrode 132. The capacitive element 220 is configured using at least the semiconductor layer 124, the gate insulating film 130, the gate electrode 132, and the capacitor line 136. A constant voltage is supplied to the capacitor line 136, and the capacitive element 220 functions as a capacitance.

The semiconductor layer 124 overlapping the gate electrode 132 constituting the capacitive element 220 is doped with impurities.

An insulating film 138 is arranged on the insulating film 134 and the capacitor line 136. The insulating film 138 is, for example, an organic insulating film. A source electrode or drain electrode 142 is arranged on the insulating film 138. The source electrode or drain electrode 142 is a conductive layer. The source electrode or drain electrode 142 is electrically connected to the semiconductor layer 124 using a contact hole 140. For example, the semiconductor layer 124 connected to the source electrode or drain electrode 142 is doped with impurities.

The insulating film 144 is arranged on the insulating film 138 and the source electrode or drain electrode 142. The insulating film 144 is, for example, an organic insulating film. The insulating film 134, the insulating film 138, and the insulating film 144 can reduce unevenness caused by the transistor 200, the capacitive element 220, and the source electrode or drain electrode 142. The inorganic insulating film 146 is arranged on the insulating film 144. The plurality of transistors 200 and the capacitive elements 220, the insulating film 134, the insulating film 138, the insulating film 144, and the inorganic insulating film 146 arranged on the substrate 102 are formed by known methods using known materials.

On the inorganic insulating film 146, the light-emitting element 172R is arranged in the pixel 110R, the light-emitting element 172G is arranged in the pixel 110G, and the light-emitting element 172B is arranged in the pixel 110B. The light-emitting element 172R has the pixel electrode 150, the light-emitting layer 156R, and the common electrode 160. The light-emitting element 172G has the pixel electrode 150, the light-emitting layer 156G, and the common electrode 160. The light-emitting element 172B has the pixel electrode 150, the light-emitting layer 156B, and the common electrode 160. The first common layer 154 is arranged between the pixel electrode 150 and the light-emitting layers 156R, 156G, and 156B. The second common layer 158 is arranged between the light-emitting layers 156R, 156G, and 156B and the common electrode 160. The first common layer 154 and the second common layer 158 are shared by the light-emitting elements 172R, 172G, and 172B and are commonly arranged over the light-emitting elements 172R, 172G, and 172B.

As will be described later, in the present embodiment, the pixel electrode 150 is a cathode, the common electrode 160 is an anode, the first common layer 154 includes at least one of the electron transport layer 154b and the electron injection layer 154a, and the second common layer 158 includes at least one of a hole transport layer 158a and a hole injection layer 158b. The pixel electrode 150 is electrically connected to the transistor 200 (the source electrode or drain electrode 142) included in the pixel circuit by using a contact hole 148.

A sealing film 180 is arranged on the common electrode 160. The sealing film 180 is also referred to as a passivation film. In the present embodiment, as an example, the sealing film 180 is composed of three layers. The three layers are a first inorganic insulating film 162, an organic insulating film 164 arranged on the first inorganic insulating film 162, and a second inorganic insulating film 166 arranged on the organic insulating film 164. The configuration of the sealing film 180 is not limited to the example shown in here. Since one of the objects of the present invention is to reduce the thickness of the display device 10, the sealing film 180 may be configured only by the first inorganic insulating film 162. A cover film 168 is arranged on a second inorganic film 186.

Figure 3:
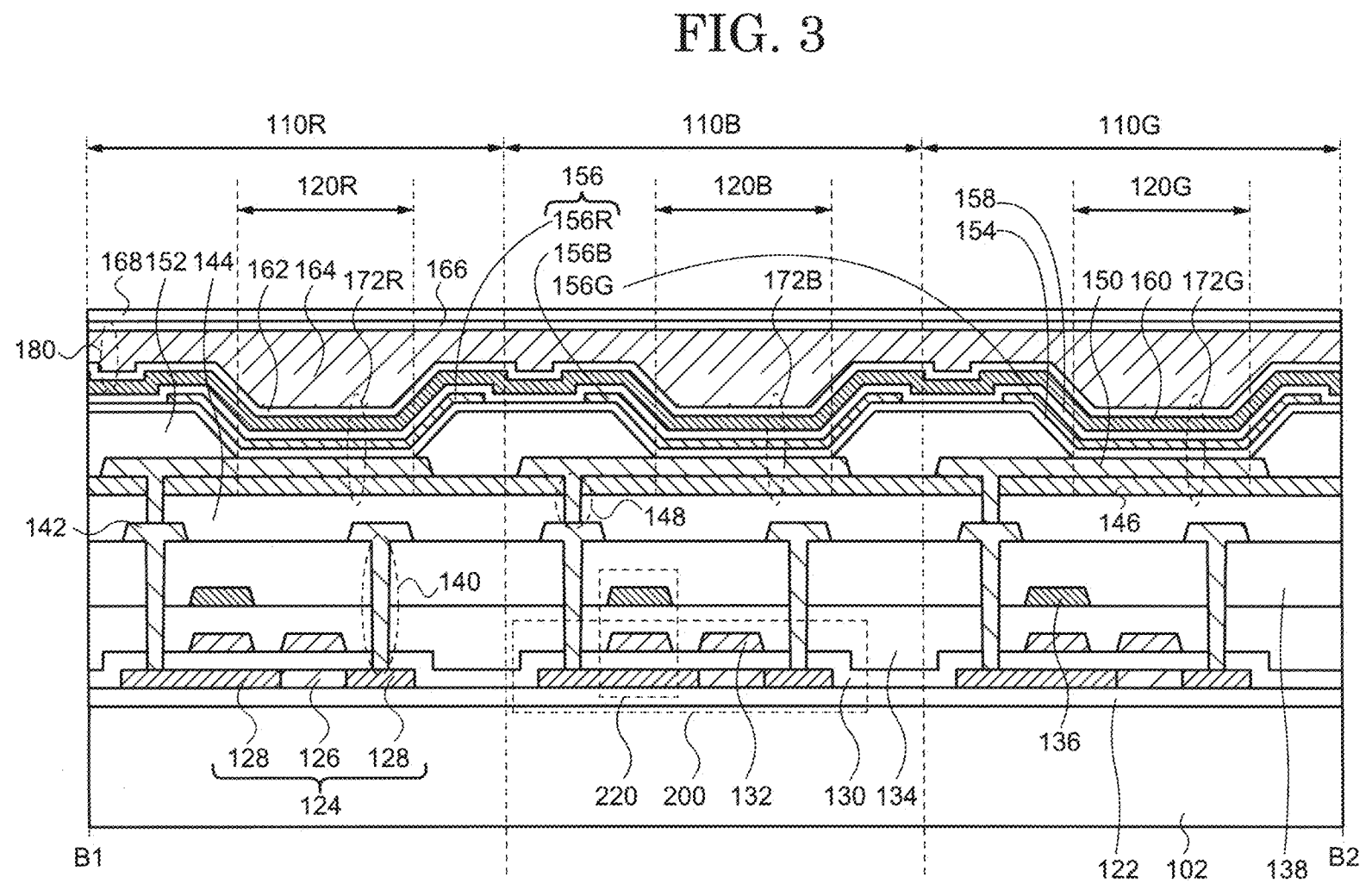
Figure 4:
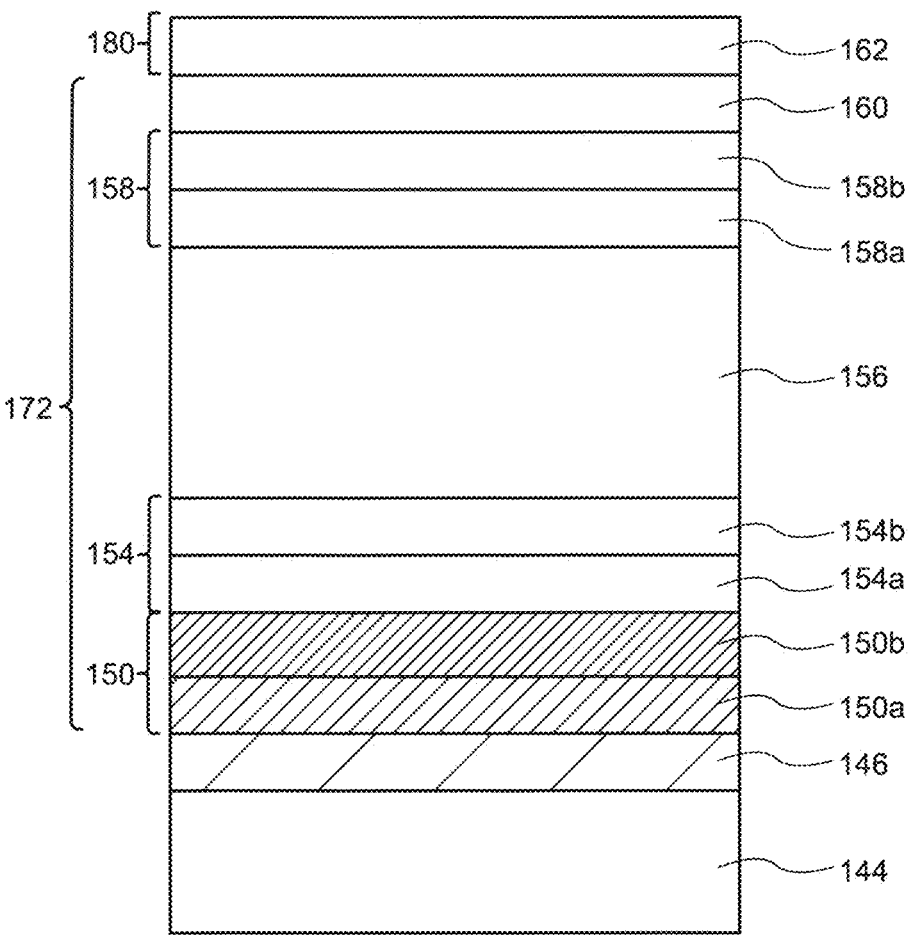
FIG. 4 is an enlarged view of a part of a cross-section of the pixel shown in FIG. 3.

A configuration of the pixel 110 will be described in detail with reference to FIG. 4. FIG. 4 is a diagram showing a part of a cross-section of the pixel 110 shown in FIG. 3. In the configuration of FIG. 4, the description of the same or similar configurations as those in FIG. 1 to FIG. 3 may be omitted. One of the objects of the present invention is to reduce the thickness of the display device 10. Therefore, in the embodiment shown in FIG. 4, as an example, the sealing film 180 is configured as a single layer. Specifically, the sealing film 180 is composed of the first inorganic insulating film 162.

As shown in FIG. 4, the inorganic insulating film 146 is arranged on the insulating film 144. The insulating film 144 may be formed of an organic compound material such as acryl or polyimide with excellent film surface flatness. The inorganic insulating film 146 is formed of a highly hermetic material that inhibits penetration of moisture, oxygen, or the like into the light-emitting element 172 from the lower layer of the inorganic insulating film 146. In the present embodiment, the insulating film 144 is formed using polyimide, and the inorganic insulating film 146 is formed using silicon nitride (SiN).

The pixel electrode 150 is arranged on the inorganic insulating film 146. The pixel electrode 150 is a cathode. The first pixel electrode 150a and the second pixel electrode 150b are formed using a transparent conductive material containing a metal oxide. In the present embodiment, the pixel electrode 150 is comprised of two layers of the first pixel electrode 150a and the second pixel electrode 150b arranged on the first pixel electrode 150a, the first pixel electrode 150a is formed using ITO, and the second pixel electrode 150b is formed using ZnO. For example, the cathode of the normal-stacked configuration is unstable to the atmosphere because it is formed using a material containing an alkali metal, whereas the cathode of the reverse-stacked configuration of the present embodiment is stable to the atmosphere because it is formed using ITO.

The first common layer 154 is arranged on the pixel electrode 150 (the second pixel electrode 150b). The light-emitting layer 156 is arranged on the first common layer 154. The second common layer 158 is arranged on the light-emitting layer 156. In the present embodiment, the first common layer 154 is composed of two layers of the electron injection layer 154a and the electron transport layer 154b arranged on the electron injection layer 154a, and the second common layer 158 is composed of two layers of the hole transport layer 158a and the hole injection layer 158b arranged on the hole transport layer 158a.

In the present embodiment, for example, a thickness of the light-emitting layer 156 is 30 nm, a thickness of the hole transport layer 158a is 20 nm, and a thickness of the hole injection layer 158b is 10 nm. In addition, the thickness or height in the present embodiment is, for example, a distance between a lower surface (portion) and an upper surface (portion) in contact with the insulating surface, by moving the insulating surface up or down, in a film, layer, material, member, or structure defined in thickness or height.

The common electrode 160 is arranged on the second common layer 158. The common electrode 160 is an anode. The common electrode 160 is formed using a transparent conductive material containing a metal oxide. In the present embodiment, for example, the common electrode 160 is formed using ITO and is stable to the atmosphere. For example, a thickness of the common electrode 160 is nm.

The sealing film 180 is arranged on the common electrode 160. In the present embodiment, as an example, the sealing film 180 is configured only by the first inorganic insulating film 162. Since a sealing film in the normal-stacked configuration is formed to seal the cathode formed using the material that is unstable to the atmosphere for example, SiN with a thickness of 1000 nm is used. As a result, the thickness of the display device with the normal-stacked configuration is thick and difficult to bend. On the other hand, a sealing film with the reverse-stacked configuration of the present embodiment is formed using, for example, SiN with a thickness of 100 nm to seal the cathode formed using ITO, which is stable to the atmosphere. As a result, the thickness of the display device 10 of the present embodiment is thinner than the display device with the normal-stacked configuration and easier to bend. Therefore, the display device 10 of the present embodiment has a configuration suitable for thinning.

In the present embodiment, the first common layer 154 controls the injection of electrons from the electron injection layer 154a to the electron transport layer 154b and the transport of electrons from the electron transport layer 154b to the light-emitting layer 156 based on the voltage supplied to the pixel electrode 150. The second common layer 158 controls the injection of holes from the hole injection layer 158b to the hole transport layer 158a and the transport of holes from the hole transport layer 158a to the light-emitting layer 156 based on the voltage supplied to the common electrode 160. The light-emitting layer 156 emits light using electrons supplied from the electron transport layer 154b and holes supplied from the hole transport layer 158a.

Figure 5:
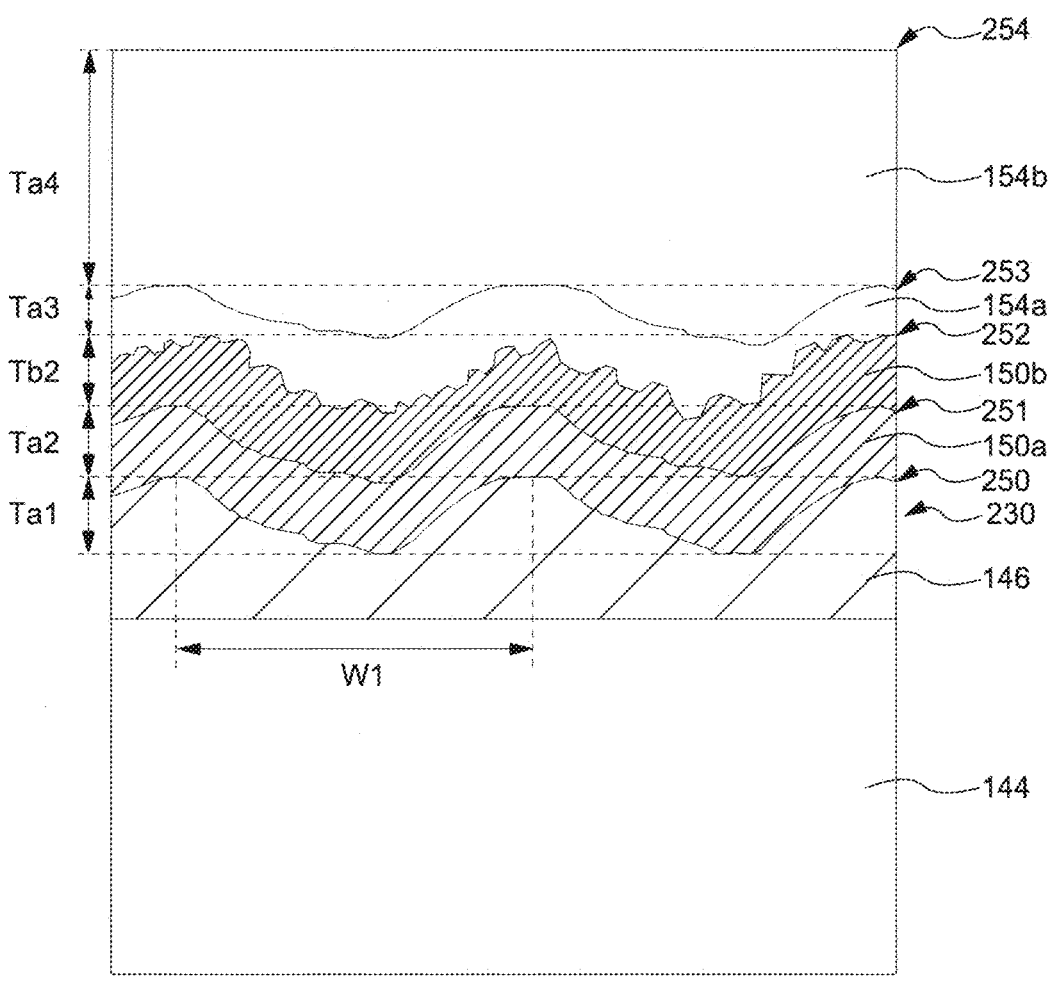
FIG. 5 is an enlarged view of a part of a cross-section of the pixel shown in FIG. 4.

With reference to FIG. 5, the configurations of the inorganic insulating film 146, the first pixel electrode 150a, the second pixel electrode 150b, the electron injection layer 154a, and the electron transport layer 154b are detailed. FIG. 5 is an enlarged view of a part of the cross-section of the pixel 110 shown in FIG. 4. In the configuration of FIG. 5, the description of the same or similar configurations as those in FIG. 1 to FIG. 4 may be omitted.

As shown in FIG. 5, the inorganic insulating film 146 is in contact with the insulating film 144. The surface (the first surface 250) of the inorganic insulating film 146 has the uneven structure 230. A height Ta1 of the uneven structure 230 is 5 nm or less, and a distance (width) W1 between a convex part of the uneven structure 230 and a concave part adjacent to the convex part is 5 μm or less. In the present embodiment, for example, the height Ta1 is 5 nm and the width W1 is 5 μm. The uneven structure 230 may be a structure formed using a photolithography technique, and may be a structure formed on the surface of the inorganic insulating film 146 by an anisotropic etching process or ashing process after the inorganic insulating film 146 is arranged.

The first pixel electrode 150a is in contact with the uneven structure 230 of the inorganic insulating film 146. A surface of the first pixel electrode 150a (a second surface 251) has an uneven structure reflecting the uneven structure 230. The first pixel electrode 150a is formed using a material containing a metal oxide. The material containing a metal oxide is, for example, ITO. In the present embodiment, the metal oxide forming the first pixel electrode 150a is referred to as a first metal oxide.

The second pixel electrode 150b is in contact with the uneven structure of the first pixel electrode 150a. The surface of the second pixel electrode 150b (the third surface 252) has the uneven structure of the first pixel electrode 150a and an uneven structure finer than the uneven structure 230. The second pixel electrode 150b formed on the first pixel electrode 150a is formed using a material containing a metal oxide different from that of the first pixel electrode 150a. The material containing a metal oxide different from that of the first pixel electrode 150a is, for example, ZnO or MoO. In the present embodiment, the metal oxide forming the second pixel electrode 150b is referred to as a second metal oxide.

A lattice constant of the material forming the first pixel electrode 150a is greater than a lattice constant of the material forming the second pixel electrode 150b. Further, a thickness Ta2 of the first pixel electrode 150a is greater than a thickness Ta3 of the second pixel electrode 150b.

In the present embodiment, the first pixel electrode 150a is formed using ITO, and the second pixel electrode 150b is formed using ZnO that is different from the material of the first pixel electrode 150a. In addition, a lattice constant of ITO is greater than a lattice constant of ZnO. Further, for example, the thickness of the first pixel electrode 150a Ta2 is 10 nm, the thickness Ta3 of the second pixel electrode 150b is 5 nm, and the thickness Ta3 of the second pixel electrode 150b is thinner than the thickness Ta2 of the first pixel electrode 150a. Therefore, the third surface 252 of the second pixel electrode 150b easily reflects the uneven structure of the second surface 251 of the first pixel electrode 150a, and becomes a surface including a finer uneven structure after reflecting the uneven structure of the second surface 251.

The electron injection layer 154a is in contact with the third surface 252 (fine uneven structure) of the second pixel electrode 150b. The electron injection layer 154a has an uneven structure (a fourth surface 253) that is gentler than the third surface 252. In the present embodiment, for example, the thickness Ta3 of the electron injection layer 154a is 3 nm. The electron transport layer 154b is arranged on the fourth surface 253 of the electron injection layer 154a. A thickness Ta4 of the electron transport layer 154b is, for example, 100 nm or more and 250 nm or less. In the present embodiment, the thickness Ta4 is, for example, 150 nm. The thickness Ta4 is sufficiently thicker than the thickness Ta3, and a surface (a fifth surface 254) of the electron transport layer 154b is flatter than the fourth surface 253.

In the display device 10, the pixel electrode 150 is composed of two layers of the first pixel electrode 150a and the second pixel electrode 150b, and the second pixel electrode 150b formed using a material different from that of the first pixel electrode 150a is arranged between the electron injection layer 154a and the first pixel electrode 150a. As a result, in the light-emitting element 172 in which the second pixel electrode 150b is arranged between the electron injection layer 154a and the first pixel electrode 150a, the energy barrier height between the pixel electrode 150 and the electron injection layer 154a is reduced by the light-emitting element 172 in which the electron injection layer 154a is arranged on the first pixel electrode 150a. Therefore, electrons are easily transferred from the pixel electrode 150 to the electron injection layer 154a in the second light-emitting element 172 in which the pixel electrode 150b is arranged between the electron injection layer 154a and the first pixel electrode 150a. That is, in the display device 10, many electrons can be transferred from the pixel electrode 150 to the electron injection layer 154a, and more electrons can be injected from the electron injection layer 154a to the light-emitting layer 156 via the electron transport layer 154b. As a result, the luminous efficacy of the display device is improved by using the display device 10.

In addition, in the display device 10, the lattice constant of the first pixel electrode 150a is greater than the lattice constant of the second pixel electrode 150b. The third surface 252 of the second pixel electrode 150b has a finer unevenness than the second surface 251 of the first pixel electrode 150a and a surface area of the third surface 252 is larger than a surface area of the second surface 251. As a result, an intermediate level is generated in the energy level between the pixel electrode 150 and the electron injection layer 154a, and the energy barrier height between the pixel electrode 150 and the electron injection layer 154a is reduced. Therefore, as the surface area of the third surface 252 becomes larger than the surface area of the second surface 251, electrons are more likely to move from the pixel electrode 150 to the electron injection layer 154a. As a result, since more electrons are injected from the electron injection layer 154a to the light-emitting layer 156 via the electron transport layer 154b, the luminous efficacy of the display device is further improved. In addition, as a result of the improvement in the luminous efficiency of the display device 10, the decrease in the luminous efficiency of the display device 10 is suppressed, and the long-term reliability of the display device 10 is also improved.

Figure 6:
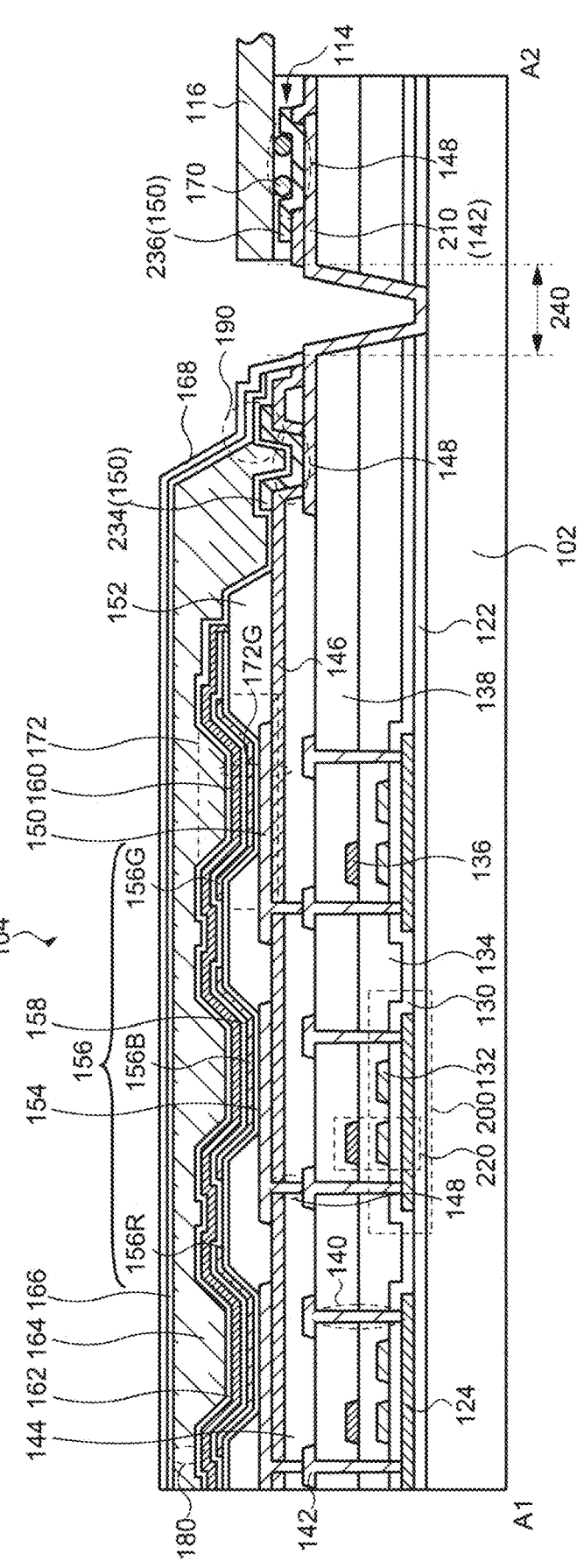
FIG. 6 is a cross-sectional view showing an example of a cross-section cut along a line A1-A2 of the display device shown in FIG. 1.

A cross-section of the display device 10 is described with reference to FIG. 6. FIG. 6 is a cross-sectional view showing an example of a cross-section cut along a line A1-A2 of the display device shown in FIG. 1. In the configuration of FIG. 6, the description of the same or similar configurations as those in FIG. 1 to FIG. 5 may be omitted. Since the configuration of the pixels 110R, 110G, and 1108 shown in FIG. 6 overlaps the configuration described with reference to FIG. 3, the description thereof will be omitted. A configuration of a cross-section of the terminal unit including the terminal 114 from a periphery of an end portion of the display unit 104 will be mainly described here.

A plurality of contact holes 148 is arranged in the insulating film 144 and the inorganic insulating film 146. The contact hole 148 not only electrically connects the pixel electrode 150 and the source electrode or drain electrode 142, but also electrically connects a connection electrode 234 and a terminal wiring 210, and a connection electrode 236 and the terminal wiring 210. Although not shown, the connection electrode 234 electrically connects the terminal wiring 210 and the data line 119, the terminal wiring 210 and the source or drain electrode 142 via the contact hole 148. In the terminal 114, the terminal wiring 210 exposed in the contact hole 148 is electrically connected to the flexible printed circuit board 116 using, for example, an anisotropic conductive film 170.

The terminal wiring 210 is formed in the same layers as the data line 119 and the source electrode or drain electrode 142 and may be a wiring forming the data line 119 and a wiring forming the source electrode or drain electrode 142. In addition, the terminal wiring 210 may be a wiring that is electrically connected to the common electrode 160, which is an anode. The connection electrode 234 and the connection electrode 236 may be formed in the same layers as the pixel electrode 150 and may be formed by the same method as the pixel electrode 150. In addition, the connection electrode 236 may be an electrode that forms the terminal 114.

For example, the driver IC 112 is electrically connected to the terminal 114, the terminal 114 is electrically connected to the connection electrode 236 and the terminal wiring 210, and the terminal wiring 210 is electrically connected to the common electrode 160, a power supply line (not shown) or a pixel circuit (not shown). A voltage is supplied to the common electrode 160, the power supply line and the pixel circuit from the driver IC 112 through the driver IC 112, the terminal 114, the connection electrode 236, and the terminal wiring 210.

The insulating film 144 and the inorganic insulating film 146 are arranged between the connection electrode 234 and the terminal wiring 210. In addition, the inorganic insulating film 146 is arranged between the connection electrode 236 and the terminal wiring 210. That is, the connection electrode 234 and the connection electrode 236 are arranged on the uneven structure 230 of the inorganic insulating film 146, have high adhesion to the inorganic insulating film 146, are hard to peel off from the inorganic insulating film 146, and are hard to break.

In addition, after the terminal wiring 210, the data line 119, and the source electrode or drain electrode 142 are formed, the terminal wiring 210, the data line 119, or the source electrode or drain electrode 142 are electrically connected using the connection electrode 234 or the connection electrode 236. As a result, damage to the terminal wiring 210, the data line 119, and the source electrode or drain electrode 142 in a manufacturing process of the display device 10 can be reduced.

The first inorganic insulating film 162 or the second inorganic insulating film 166 is arranged to cover the display unit 104. In the present embodiment, the first inorganic insulating film 162 or the second inorganic insulating film 166 is arranged to cover the display unit 104. In addition, the first inorganic insulating film 162 and the second inorganic insulating film 166 are arranged so as not to overlap the contact hole 148. This reduces the insulating film arranged between the terminal wiring 210, the data line 119, or the source electrode or drain electrode 142, and the connection electrode 234 or the connection electrode 236. As a result, an electrical connection with a lower contact resistance can be achieved between the terminal wiring 210, the data line 119, or the source or drain electrode 142 and the connection electrode 234 or the connection electrode 236.

In the present embodiment, the first inorganic insulating film 162 and the second inorganic insulating film 166 are in direct contact with each other around the display unit 104 (a contact part 190). This allows the first inorganic insulating film 162 and the second inorganic insulating film 166 to be used to seal the organic insulating film 164 that is more hydrophilic than the first inorganic insulating film 162 and the second inorganic insulating film 166. As a result, it is possible to suppress the entry of impurities from the outside into the display device 10 more effectively and suppress the diffusion of impurities within the display unit 104.

The cover film 168 is arranged on the second inorganic insulating film 166. The terminal wiring 210 is arranged so as to contact a curved part 240 and the substrate 102 where the insulating film 138, the insulating film 134, the gate insulating film 130, and the base film 122 are opened. The curved part 240 is a bendable area of the display device 10. The cover film 168 protects the surface of the display device up to the bendable area.

Although not shown, a cover film may be arranged below the base film 122. The cover film arranged below the base film 122 suppresses damage to the base film 122 and protects the back surface of the display device 10. In addition, in the display device 10, the cover film below the cover film 168 or the base film 122 may not be arranged, and if the cover film 168 or the cover film arranged below the base film 122 is a material that is sufficiently flexible to bending, it may be extended and arranged to the bendable area.

3. Second Embodiment

Figure 7:
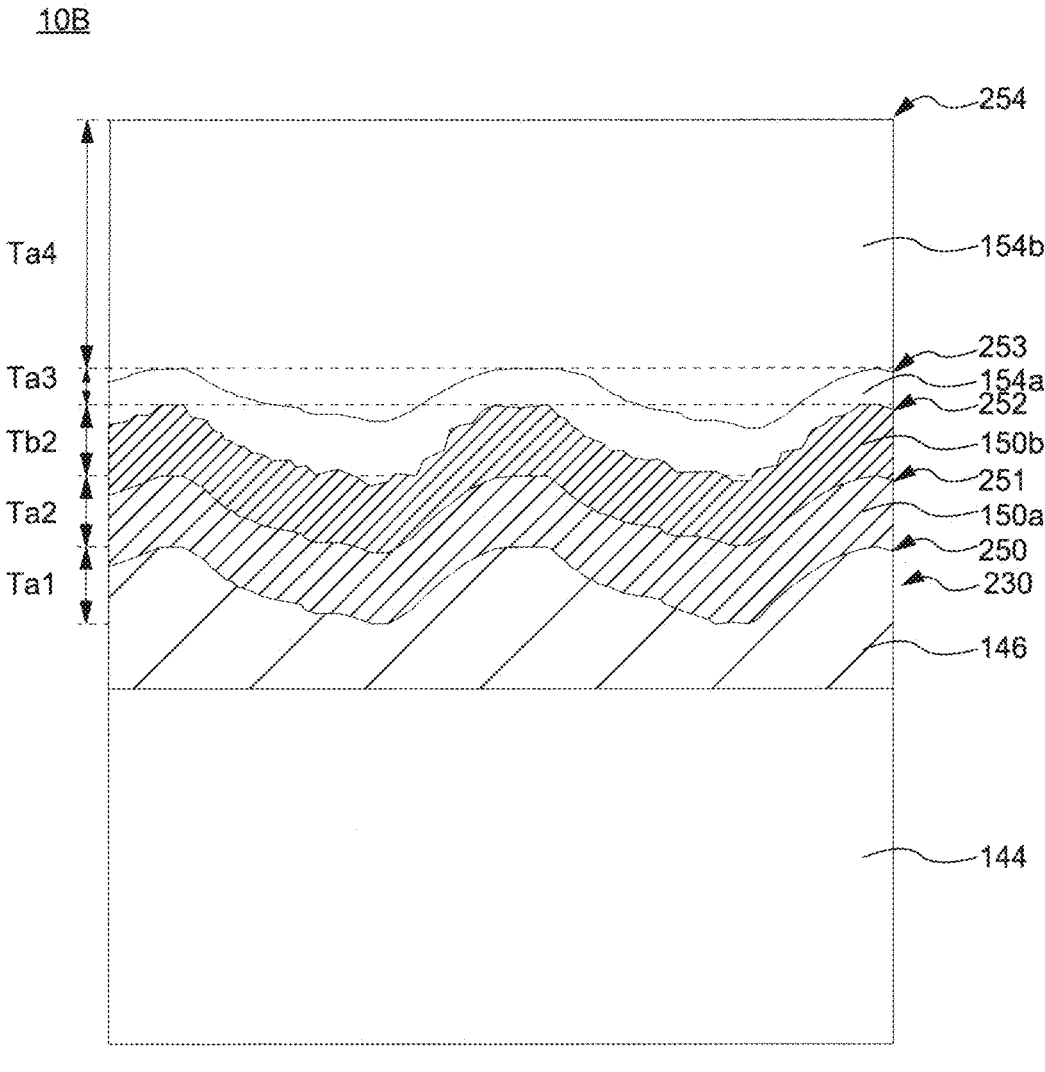
FIG. 7 is an enlarged view of a part of a cross-section of the pixel shown in FIG. 4 in a display device according to a second embodiment.

A display device 10B according to the second embodiment will be described with reference to FIG. 7. FIG. 7 is an enlarged view of a part of a cross-section of the pixel shown in FIG. 4 in the display device 10B. The form of the display device 10B shown in FIG. 7 is an example, and the form of the display device 10B is not limited to the form shown in FIG. 7. In the configuration of FIG. 7, the description of the same or similar configurations as those in FIG. 1 to FIG. 6 may be omitted.

In the configuration shown in FIG. 7, the second pixel electrode 150b has a configuration similar to the first pixel electrode 150a as compared with the configuration of the display device 10 according to the first embodiment. Since other configurations are the same as those of the first embodiment, the description thereof will be omitted.

In the second embodiment, the second pixel electrode 150b is formed using ITO that is similar to the first pixel electrode 150a. The second pixel electrode 150b is in contact with the uneven structure of the first pixel electrode 150a. In the case where the layers formed using a similar material overlap, crystals become discontinuous at a grain boundary between the lower layer and the upper layer, and the uneven structure of the upper layer becomes a slightly finer uneven structure than the uneven structure of the lower layer. That is, in the second pixel electrode 150b, the grain boundary at the surface in contact with the uneven structure of the first pixel electrode 150a becomes discontinuous, and the surface of the second pixel electrode 150b (the third surface 252) becomes a surface having an uneven structure slightly finer than the uneven structure of the first pixel electrode 150a.

In the electron injection layer 154a, the surface in contact with the third surface 252 becomes a surface having a slightly finer uneven structure than the uneven structure of the first pixel electrode 150a similar to the third surface 252. Therefore, in the display device 10B, the surface area of the third surface 252 of the second pixel electrode 150b is larger than the surface area of the flat surface. As a result, an intermediate level is generated in the energy level between the pixel electrode 150 and the electron injection layer 154a, and the energy barrier height between the pixel electrode 150 and the electron injection layer 154a is reduced. As a result, since more electrons are injected from the electron injection layer 154a to the light-emitting layer 156 via the electron transport layer 154b, the luminous efficiency of the display device 10B is improved. In addition, as a result of the improvement in the luminous efficiency of the display device 10B, the decrease in the luminous efficiency of the display device 10B is suppressed, and the long-term reliability of the display device 10 is also improved.

4. Third Embodiment

Figure 8:
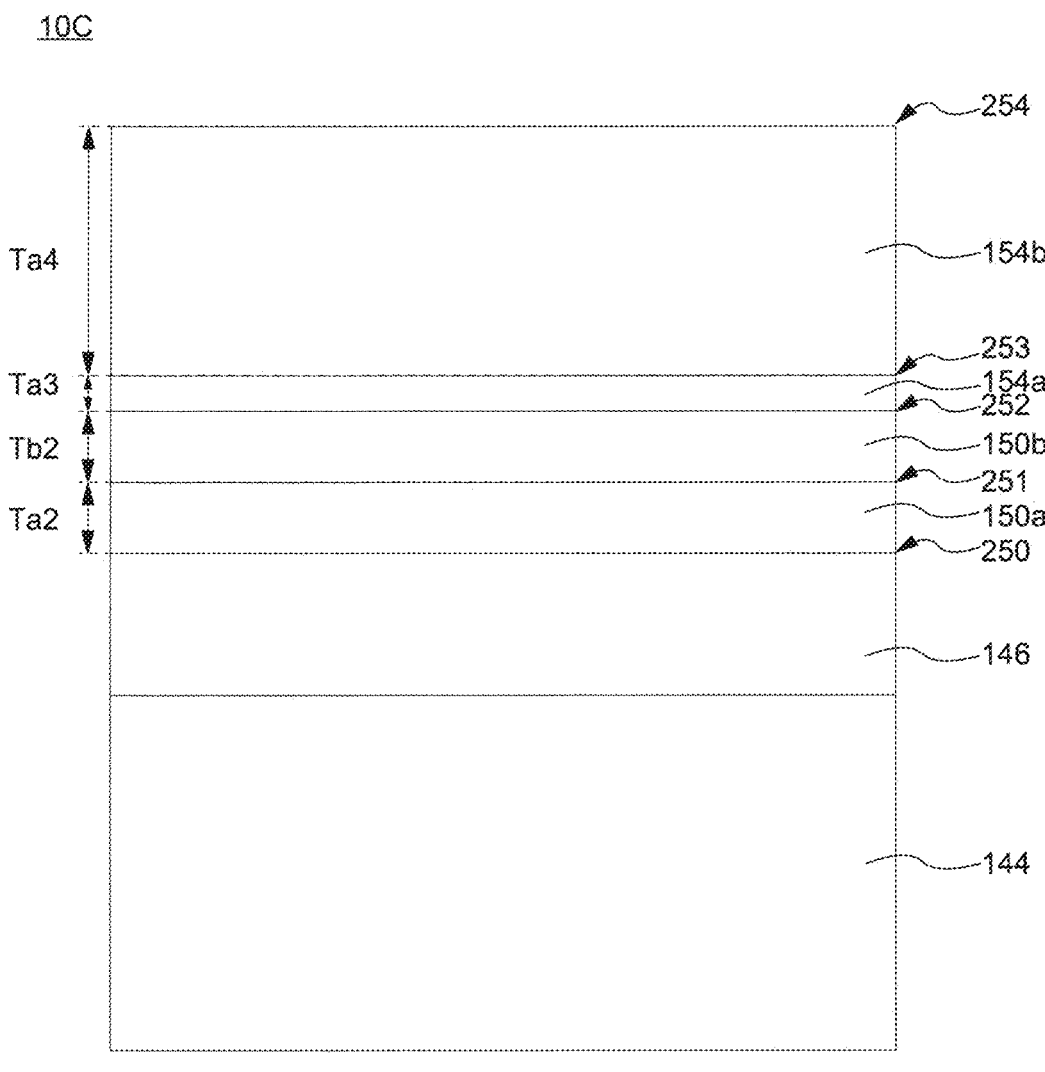
FIG. 8 is an enlarged view of a part of a cross-section of the pixel shown in FIG. 4 in a display device according to a third embodiment.

A display device 100 according to the third embodiment will be described with reference to FIG. 8. FIG. 8 is an enlarged view of a part of a cross-section of the pixel shown in FIG. 4 in the display device 100. The form of the display device 100 shown in FIG. 8 is an example, and the form of the display device 100 is not limited to the form shown in FIG. 8. In the configuration of FIG. 8, the description of the same or similar configurations as those in FIG. 1 to FIG. 7 may be omitted.

In the configuration shown in FIG. 8, the surface (the first surface 250) of the inorganic insulating film 146 has a flat or substantially flat surface as compared with the configuration of the display device 10B according to the second embodiment. Since other configurations are the same as those of the first embodiment, the description thereof will be omitted.

In the display device 100 according to the third embodiment, the first pixel electrode 150a is formed using ITO, and the second pixel electrode 150b is formed using ZnO. The second pixel electrode 150b formed using a material different from that of the first pixel electrode 150a is arranged between the electron injection layer 154a and the first pixel electrode 150a. As a result, in the light-emitting element 172 in which the second pixel electrode 150b is arranged between the electron injection layer 154a and the first pixel electrode 150a, the energy barrier height between the pixel electrode 150 and the electron injection layer 154a is reduced by the light-emitting element 172 in which the electron injection layer 154a is arranged on the first pixel electrode 150a. Therefore, in the display device 100 according to an embodiment of the present invention, more electrons can be transferred from the pixel electrode 150 to the electron injection layer 154a. As a result, more electrons are injected from the electron injection layer 154a to the light-emitting layer 156 via the electron transport layer 154b, thereby improving the luminous efficacy.

5. Fourth Embodiment

Figure 9:
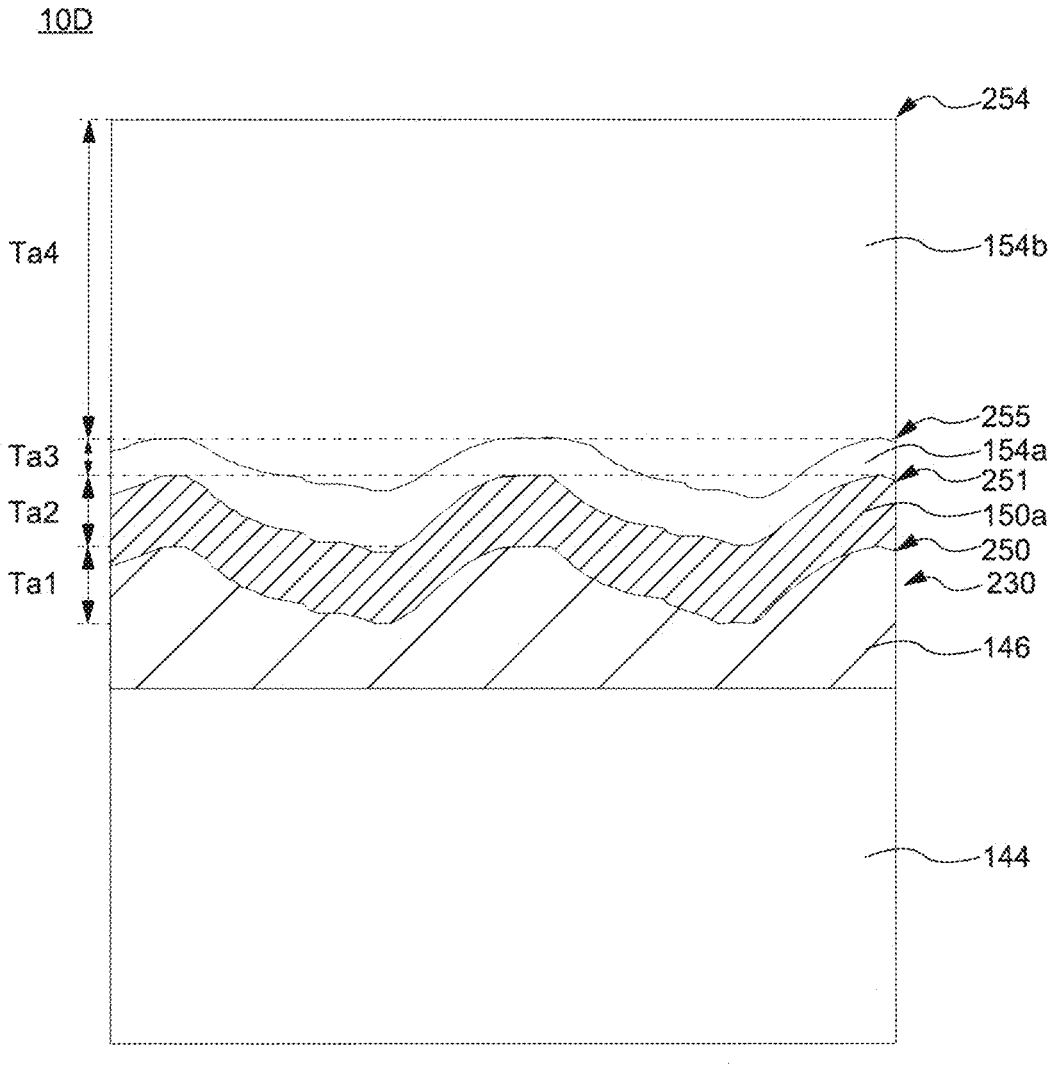
FIG. 9 is an enlarged view of a part of a cross-section of the pixel shown in FIG. 4 in a display device according to a fourth embodiment.

A display device 10D according to a fourth embodiment will be described with reference to FIG. 9. FIG. 9 is an enlarged view of a part of a cross-section of the pixel shown in FIG. 4 in the display device 10D. The form of the display device 10D shown in FIG. 9 is an example, and the form of the display device 10D is not limited to the form shown in FIG. 9. In the configuration of FIG. 9, the description of the same or similar configurations as those in FIG. 1 to FIG. 8 may be omitted.

In the configuration shown in FIG. 9, the pixel electrode 150 is formed of a single layer using the first pixel electrode 150a as compared with the configuration of the display device 10B according to the second embodiment. Since other configurations are the same as those of the second embodiment, the description thereof will be omitted.

In the display device 10D according to the fourth embodiment, the pixel electrode 150 is formed of a single layer using the first pixel electrode 150a. The first pixel electrode 150a is formed using ITO. The electron injection layer 154a is arranged on the first pixel electrode 150a. A surface (a sixth surface 255) of the electron injection layer 154a has an uneven structure reflecting the uneven structure 230 of the first pixel electrode 150a. In the display device 10D, a surface area of the sixth surface 255 of the first pixel electrode 150a and the electron injection layer 154a is larger than the surface area of the flat surface. As a result, an intermediate level is generated in the energy level between the first pixel electrode 150a and the electron injection layer 154a, and the energy barrier height between the first pixel electrode 150a and the electron injection layer 154a is reduced. Therefore, since more electrons are injected from the electron injection layer 154a to the light-emitting layer 156 via the electron transport layer 154b, the luminous efficiency of the display device 10D is improved.

6. Fifth Embodiment

Figure 10:
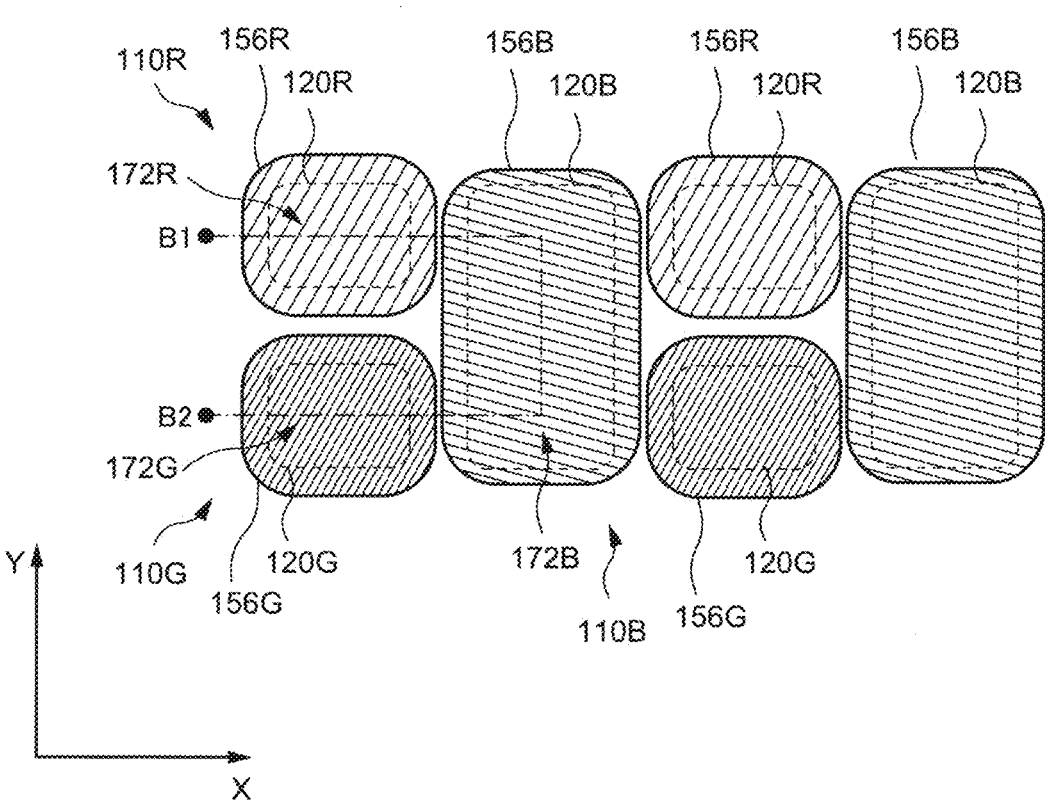
FIG. 10 is an enlarged view of pixels included in a display device according to a fifth embodiment.

A display device 10E according to a fifth embodiment will be described with reference to FIG. 10. FIG. 10 is an enlarged view of the pixel 110R, the pixel 110G, and the pixel 1108 when the display device 10E is in a plan view. A pixel arrangement of the display device 10E is a pixel arrangement in which the size of the pixel 1108 is larger than the size of the pixel 110R and the size of the pixel 110G. Since other configurations are the same as those of the first embodiment, the description thereof will be omitted. In the configuration of FIG. 10, the description of the same or similar configurations as those in FIGS. 1 to FIG. 9 may be omitted.

FIG. 10 shows an area where the pixels 110R, 110G, and 1108 are arranged. The pixel 110R and the pixel 1108 are arranged in the direction X. The pixel 110G and the pixel 1108 are arranged in the direction X. The pixel 110R and the pixel 110G are arranged in the direction Y. The present invention is also applicable to a pixel arrangement different from the stripe arrangement.

7. Sixth Embodiment

Figure 11:
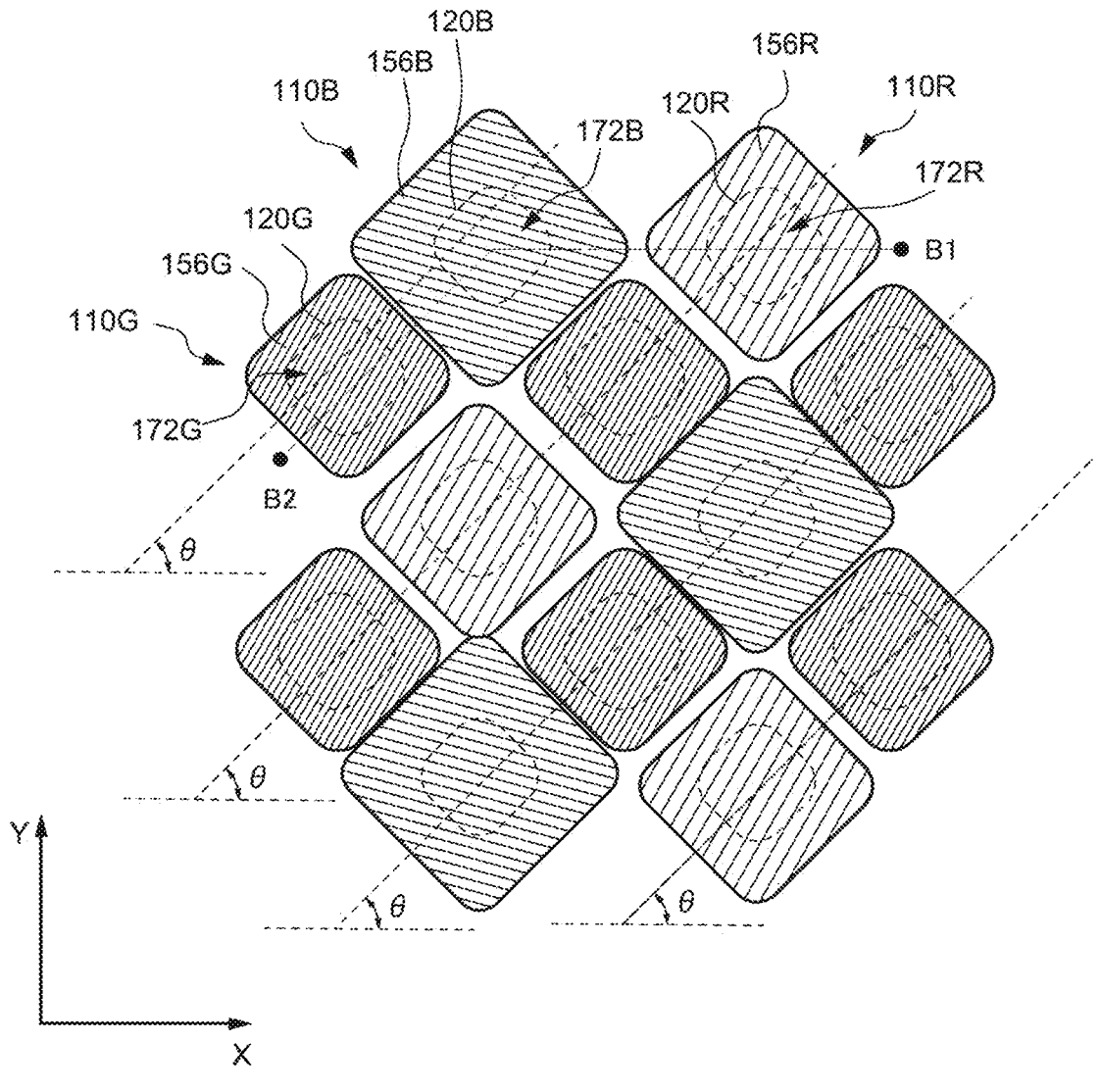
FIG. 11 is an enlarged view of pixels included in a display device according to a sixth embodiment.

A display device 10F according to a sixth embodiment will be described with reference to FIG. 11. FIG. 11 is an enlarged view of the pixel 110R, the pixel 110G, and the pixel 1108 when the display device 10F is in a plan view. A pixel arrangement of the display device 10F is a pixel arrangement arranged in a pentile shape. Since other configurations are the same as those of the first embodiment, the description thereof will be omitted. In the configuration of FIG. 11, the description of the same or similar configurations as those in FIGS. 1 to FIG. 10 may be omitted.

FIG. 11 shows an area where the pixels 110R, 110G, and 110B are arranged. The plurality of pixels 110G is arranged side by side in the direction X. The pixel 110G and the pixel 110B are arranged in parallel to a line inclined by an angle θ with respect to a line parallel to the direction X. In addition, the pixel 110G and the pixel 110R are also arranged in parallel to the line inclined by the angle θ with respect to the line parallel to the direction X. The present invention is also applicable to a pixel arrangement different from the stripe arrangement.

Each of the embodiments described above as an embodiment of the present invention can be appropriately combined and implemented as long as no contradiction is caused. In addition, the addition, deletion, or design change of components, or the addition, deletion, or condition change of processes as appropriate by those skilled in the art based on each embodiment are also included in the scope of the present invention as long as they are provided with the gist of the present invention.

Further, it is understood that, even if the effect is different from those provided by each of the above-described embodiments, the effect obvious from the description in the specification or easily predicted by persons ordinarily skilled in the art is apparently derived from the present invention.

What is claimed is:

1. A light-emitting element comprising:
an inorganic insulating film having a first surface, the first surface has an uneven structure;
a pixel electrode arranged on the inorganic insulating film;
an electron injection layer arranged on the pixel electrode;
an electron transport layer arranged on the electron injection layer;
a light-emitting layer arranged on the electron transport layer; and
a common electrode arranged on the light-emitting layer, wherein the pixel electrode includes a first electrode having a second surface, and a second electrode having a third surface,
the first electrode is in contact with the first surface,
the second electrode is in contact with the second surface, and
the third surface has an uneven structure finer than the uneven structure of the first surface.

2. The light-emitting element according to claim 1, wherein
the pixel electrode is a cathode, and
the common electrode is an anode.

3. The light-emitting element according to claim 1, wherein
the first electrode contains a first metal oxide, and
the second electrode contains a second metal oxide different from the first metal oxide.

4. The light-emitting element according to claim 3, wherein
a lattice constant of the second metal oxide is smaller than a lattice constant of the first metal oxide.

5. The light-emitting element according to claim 3, wherein
the first metal oxide is ITO, and
the second metal oxide is ZnO or MoO.

6. The light-emitting element according to claim 1, wherein
a thickness of the second electrode is thinner than a thickness of the first electrode, and
a thickness of the electron injection layer is thinner than the thickness of the first electrode.

7. The light-emitting element according to claim 1, wherein
the uneven structure of the first surface has convex parts, and
a distance between one of the convex parts and another one of the convex parts adjacent to the one of the convex parts is 5 μm or less.

8. A display device including the light-emitting element according to claim 1, comprising:
a display unit including a plurality of the light-emitting elements; and
a control circuit electrically connected to the plurality of the light-emitting elements and controlling the plurality of the light-emitting elements.

9. The display device according to claim 8, wherein
the pixel electrode is a cathode, and
the common electrode is an anode.

10. The display device according to claim 8, wherein
the first electrode contains a first metal oxide, and
the second electrode contains a second metal oxide different from the first metal oxide.

11. The display device according to claim 10, wherein
a lattice constant of the second metal oxide is smaller than a lattice constant of the first metal oxide.

12. The display device according to claim 10, wherein
the first metal oxide is ITO, and
the second metal oxide is ZnO or MoO.

13. The display device according to claim 8, wherein
a thickness of the second electrode is thinner than a thickness of the first electrode, and
a thickness of the electron injection layer is thinner than the thickness of the first electrode.

14. The display device according to claim 8, wherein
the uneven structure of the first surface has convex parts, and a distance between one of the convex parts and another one of the convex parts adjacent to the one of the convex parts is 5 μm or less.

\* \* \* \* \*